United States Patent [19]

Cathey et al.

[11] Patent Number: 5,069,747

[45] Date of Patent: Dec. 3, 1991

[54] CREATION AND REMOVAL OF TEMPORARY SILICON DIOXIDE STRUCTURES ON AN IN-PROCESS INTEGRATED CIRCUIT WITH MINIMAL EFFECT ON EXPOSED, PERMANENT SILICON DIOXIDE STRUCTURES

[75] Inventors: David A. Cathey; Mark E. Tuttle; Ruojia Lee; Tyler A. Lowrey, all of Boise, Id.

[73] Assignee: Micron Technology, Inc., Boise, Id.

[21] Appl. No.: 633,573

[22] Filed: Dec. 21, 1990

[51] Int. Cl.$^5$ .................... B44C 1/22; C03C 15/00; C03C 25/06
[52] U.S. Cl. .................... 156/643; 156/651; 156/653; 156/657; 437/238
[58] Field of Search ............ 156/643, 651, 653, 657, 156/659.1, 662; 437/40, 41, 42, 43, 238; 357/23.1, 23.9, 23.11, 49

[56] References Cited

U.S. PATENT DOCUMENTS

| | | | |
|---|---|---|---|
| 4,735,680 | 4/1988 | Yen | 156/643 |
| 4,784,718 | 11/1988 | Mitani et al. | 156/653 X |
| 4,878,996 | 11/1989 | Mitchell et al. | 156/653 |
| 4,996,167 | 2/1991 | Chen | 437/40 |
| 5,037,505 | 8/1991 | Tung | 156/643 |

Primary Examiner—William A. Powell
Attorney, Agent, or Firm—Angus C. Fox, III

[57] ABSTRACT

A process for creating and removing temporary silicon dioxide structures on an in-process integrated circuit with minimal effect on existing permanent silicon dioxide structures that are exposed. The process comprises the steps of blanket depositing an ozone-TEOS silicon dioxide layer through chemical vapor deposition on top of the in-process integrated circuit, thus covering permanent structures formed from conventional silicon dioxides (e.g. TEOS and thermal oxides), etching the ozone-TEOS layer to create said temporary structures, and removing the temporary structures using dilute hydrofluoric acid.

9 Claims, 3 Drawing Sheets

CREATION AND REMOVAL OF TEMPORARY SILICON DIOXIDE STRUCTURES ON AN IN-PROCESS INTEGRATED CIRCUIT WITH MINIMAL EFFECT ON EXPOSED, PERMANENT SILICON DIOXIDE STRUCTURES

FIELD OF THE INVENTION

This invention relates to integrated circuit technology and, more specifically, to processes for creating disposable spacers during circuit fabrication.

BACKGROUND OF THE INVENTION

The use of temporary structures—particularly disposable sidewall spacers—during semiconductor fabrication has become relatively widespread. By definition, a disposable sidewall spacer is created from material that may be etched at a much faster rate than the materials from which permanent circuit structures are created. Typically, the use of disposable sidewall spacers is called for when spacers are required only temporarily during a particular fabrication step, and their later presence would hinder subsequent fabrication steps or device performance.

Process engineers at IBM Corporation have used organic polymer material to create disposable sidewall structures that may be easily dissolved with an organic solvent, without damaging existing semiconductor structures. Both U.S. Pat. No. 4,838,991, issued to William J. Cote, et al, and entitled "Process for Defining Organic Sidewall Structures", and U.S. Pat. No. 4,502,914, issued to Hans-Joachim Trumpp, et al, and entitled "Method of Making Structures With Dimensions in the Sub-Micrometer Range", are examples of this process technology.

Sidewall spacers are most commonly used during integrated circuit fabrication to offset source/drain implants from the edges of MOSFET gates. Although sidewall spacers have typically been left intact after source/drain implantation steps, there are compelling reasons to make the sidewall spacers either partially or completely disposable. A pair of processes which make use of partially or completely disposable sidewall spacers are briefly described below.

U.S. Pat. No. 4,745,086, issued to Stephen J. Consentino, et al, and entitled "Removable Sidewall Spacer for Lightly Doped Drain Formation Using One Mask Level and Differential Oxidation" describes a process whereby completely disposable sidewall spacers made from CVD tungsten or polysilicon are utilized to offset heavily-doped source/drain implants. Following removal of the disposable spacers, the lightly-doped source/drain implants are performed.

In the quest for ever greater circuit density, process engineers may decide to use partially-disposable spacers. For example, in certain DRAM processes involving stacked-cell designs, it may be advantageous to remove the disposable portion of a partially-disposable spacer following its use as an implant block, in order to enlarge the size of a buried contact opening between adjacent wordlines. Because the disposable portion of the partially-disposable spacer etches at a much faster rate than the non-disposable portion, the latter remains intact upon removal of the former. The non-disposable portion serves to insulate wordline sidewalls from stacked capacitive elements within individual memory cells. FIGS. 1 through 6 are representative of such a process.

Referring now to FIG. 1, a pair of adjacent wordlines have been created on a portion of an in-process silicon wafer. The leftmost wordline 11 is insulated from the substrate 12 by a gate oxide layer 13, while the rightmost wordline 14 is insulated from substrate 12 by a field oxide region 15. A first implant spacer layer 16 has been blanket deposited over the surface of the wafer, following which phosphorus is implanted to create lightlydoped source and drain regions 17. First implant spacer layer 16 may be TEOS CVD oxide, wet or dry thermallygrown oxide, silane CVD oxide, various other types of conventional oxide, or other dielectric material such as silicon nitride.

Referring now to FIG. 2, a second implant spacer layer 21 has been blanket deposited over the surface of the wafer.

Referring now to FIG. 3, first implant spacer layer 16 and second implant spacer layer 21 have been anisotropically etched in order to clear a region of substrate 12 between leftmost wordline 11 and rightmost wordline 14. Of the two implant spacer layers, only first implant spacer layer remnants 31 and second implant spacer layer remnants 32 remain. Arsenic is then implanted to create heavily-doped source and drain regions 33. It will be noticed that the width of the cleared substrate area 34 is very narrow. A buried contact must be made to this junction region within the substrate. Due to the narrowness of the cleared substrate area 34, it must be widened if successful contact is to be made to the substrate.

Referring now to FIG. 4, second implant spacer layer remnants 32 are removed, leaving first implant spacer layer remnants 31 intact. The deposition of a substrate-insulating layer 41, the function of which is to insulate the substrate in non-buried contact regions from subsequently-deposited conductive layers, follows.

Referring now to FIG. 5, substrate-insulating layer 41 is etched to the extent that a region of substrate 12 between leftmost wordline 11 and rightmost wordline 14 is cleared a second time. Due to the relative thinness of substrate-insulating layer 41 (compared with second implant spacer layer 21), the portion of substrate cleared the second time is much wider than the portion cleared prior to the heavily-doped source and drain implants.

Referring now to FIG. 6, a buried contact conductive layer 61 is blanket deposited over the surface of the wafer. Conductive layer 61 will ultimately be patterned and may serve as a storage node plate or a digit line for a DRAM cell capacitor.

The process described above is of interest because of the requirement that second implant spacer layer 21 must be removable without significantly etching the first implant spacer layer 16 and any exposed portions of field oxide regions 15. The ideal disposable structure material should have several characteristics: Firstly, it should be readily removable without damaging all other permanent structures that may be exposed during the removal process; secondly, it should deposit in a highly conformal manner; thirdly, it should be sufficiently dense to act as an implant block; fourthly, it should be both anisotropically and isotropically etchable, and fifthly, it should be a dielectric material that will not cause shorts and will not spike junctions if small amounts are not cleared from the circuitry.

Disposable structural materials used in prior art processes are far from ideal. If CVD tungsten or CVD polysilicon is utilized for disposable structures, failure to effect a complete removal of the material may cause shorting within the circuit. Other materials, including silicon nitride, have also been used as a disposable spacer materials. However, removal can not always be accomplished without significant damage to other existing structures.

What is needed is a temporary structure material that is a dielectric, can be deposited in a highly conformal manner, and that can be rapidly removed without significantly affecting permanent semiconductor structures, including those constructed from silicon dioxide.

SUMMARY OF THE INVENTION

This invention constitutes a process for creating disposable silicon dioxide structures on in-process semiconductor circuitry and removing those structures when they are no longer needed or wanted, without significantly etching existing permanent structures, including those made of conventional types of silicon dioxide.

A silicon dioxide layer is deposited by chemical vapor deposition when ozone-enriched (approximately 8% $O_3$ by weight) oxygen gas and tetraethyl-orthosilicate gas are mixed in a deposition chamber at approximately 400° C. This type of silicon dioxide, which shall hereinafter be referred to as ozone-TEOS oxide, has certain peculiar characteristics. First, it dissolves rapidly in dilute (1:100) hydrofluoric acid. Secondly, it deposits with a high degree of conformality. Thirdly, it is sufficiently dense to function as an effective implant blocking material. Fourthly, it is relatively inexpensive to deposit. Fifthly, it may be both anisotropically and isotropically etched to create insulative structures. It is hypothesized that rapid dissolvability of ozone-TEOS oxide in dilute hydrofluoric acid may be related to its high porosity and the presence of hydroxyl groups therein.

For the purposes of this process, conventional types of silicon dioxide shall be defined to include those that are formed by all presently known processes other than by mixing ozone-enriched oxygen and TEOS gases. These include silicon dioxide that is grown using chemical vapor deposition techniques (i.e. TEOS oxide and oxide grown from nitrous oxide or silane), and silicon dioxide that is thermally grown in either dry environment or wet environments.

Because of its conformal deposition characteristics, ozone-TEOS oxide is currently being used to create permanent structures within semiconductor circuitry. However, because of its desiccant characteristics, it is necessary to anneal ozone-TEOS oxide layers subsequent to their deposition in order to densify the material and eliminate its desiccant characteristics. If unannealed ozone-TEOS oxide is used for permanent structures, cyclical absorptions and releases of moisture by the material may hinder subsequent process steps and/or create severe corrosion problems within the completed circuit—especially if a metal such as aluminum is present.

It has been determined by the developers of the process disclosed herein, that because ozone-TEOS has an etch rate in dilute hydrofluoric acid that is up to 100 times greater than etch rate of conventional types of silicon dioxide, it is an excellent material for disposable spacers, partially-disposable spacers, and other temporary structures used during the manufacture of silicon semiconductor circuits. The same layer of ozoneTEOS may also be used to create both temporary and permanent structures by etching away the temporary structures after they have served their usefulness, while protecting the permanent structures with photoresist. Following the removal of the protective photoresist, the ozone-TEOS oxide comprising the permanent structures may be annealed.

PREFERRED EMBODIMENT OF THE INVENTION

The process which constitutes the invention will be described in reference to FIGS. 1 through 6, which have been referred to heretofore, in the context of the prior art.

Figure 1:
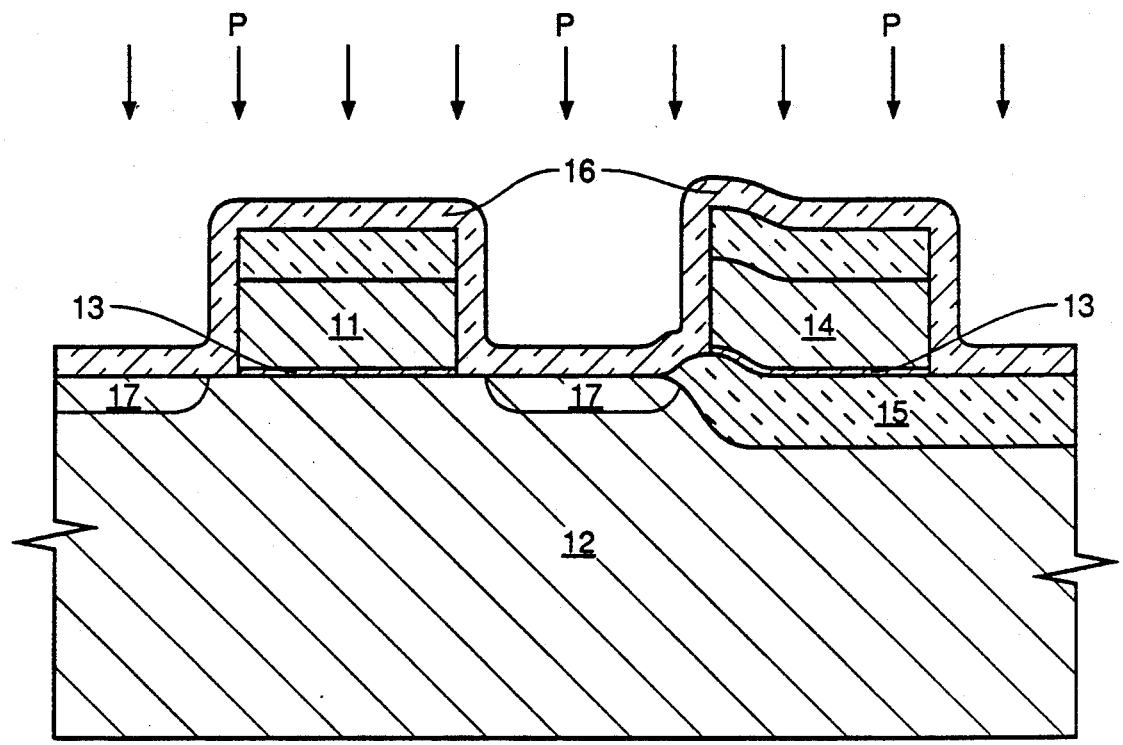
FIG. 1 is a cross-sectional view of an in-process semiconductor wafer portion showing a pair of adjacent wordlines of a DRAM array undergoing fabrication following the blanket deposition of a first implant spacer layer, and implantation with phosphorus.

Referring now to FIG. 1, a pair of adjacent wordlines have been created on a portion of an in-process silicon wafer. Both wordlines, which are conductive strips from which field-effect transistor gates will be formed at specific locations within the circuit, have been patterned from a bilaminal layer consisting of a doped polysilicon layer subjacent an oxide layer. Leftmost wordline 11 is insulated from the substrate 12 by a gate oxide layer 13, while rightmost wordline 14 is insulated from substrate 12 by a field oxide region 15. A first implant spacer layer 16 consisting of conventional silicon dioxide has been created. It may be either blanket deposited through chemical vapor deposition (e.g., TEOS oxide) or it may be thermally grown on exposed monocrystalline silicon and polycrystalline silicon surfaces (i.e., exposed portions of the substrate 12 and the edges of leftmost wordline 11 and rightmost wordline 14. Following the creation of first implant spacer layer 16, a blanket implantation with phosphorus is performed, thus creating lightly-doped source and drain regions 17.

Figure 2:
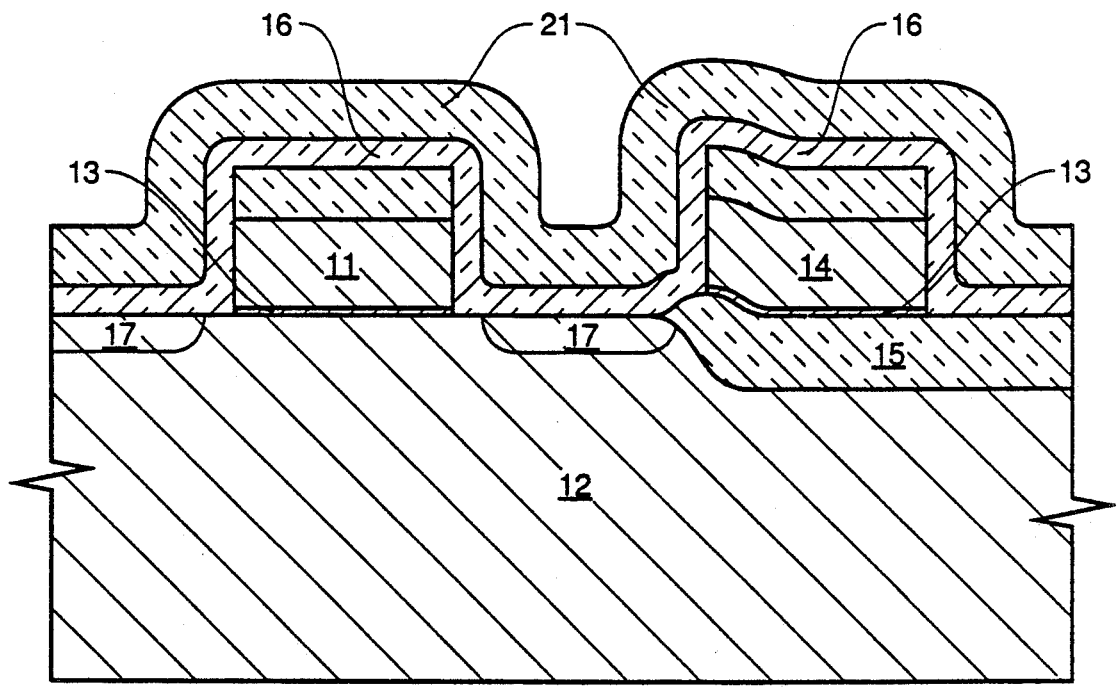
FIG. 2 is a cross-sectional view of the in-process wafer portion of FIG. 1, following the blanket deposition of a second implant spacer layer.

Referring now to FIG. 2, a second implant spacer layer 21 consisting of ozone-TEOS silicon dioxide has been blanket deposited over the surface of the wafer.

Figure 3:
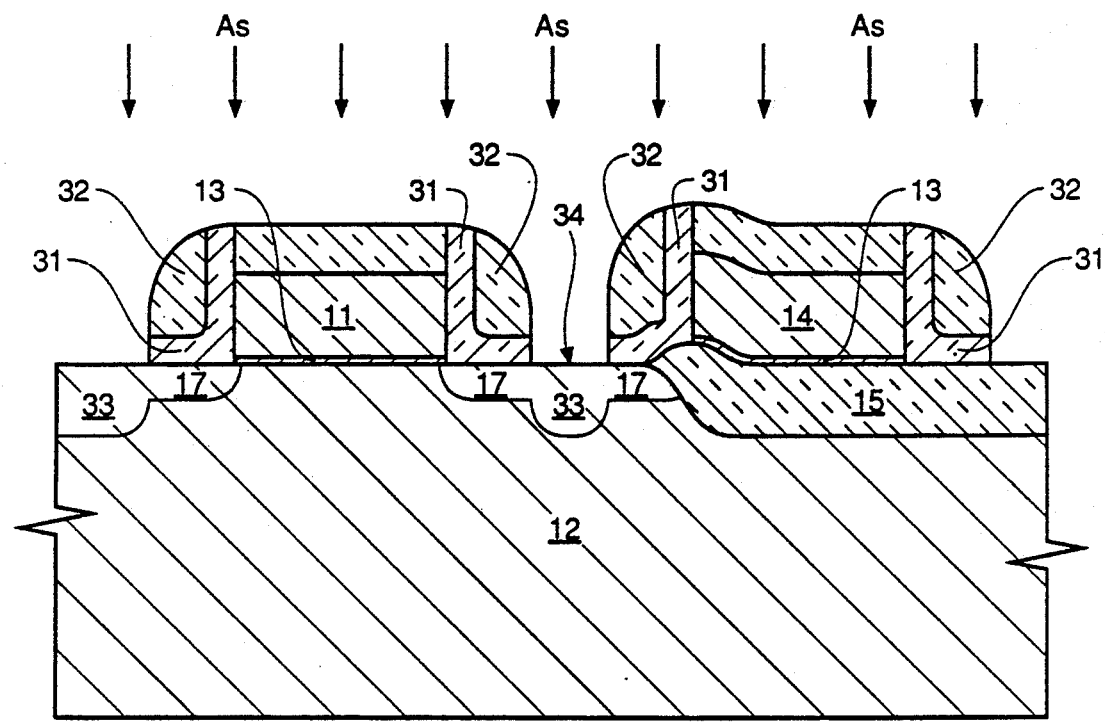
FIG. 3 is a cross-sectional view of the in-process wafer portion of FIG. 2, following the anisotropic etch of the first implant spacer layer and the second implant spacer layer, and implantation with arsenic.

Referring now to FIG. 3, first implant spacer layer 16 and second implant spacer layer 21 have been anisotropically etched within a plasma reactor to the extent that a region of substrate 12 between leftmost wordline 11 and rightmost wordline 14 has been cleared. Of the two implant spacer layers, only first implant spacer layer remnants 31 and second implant spacer layer remnants 32 remain. Arsenic is then implanted to create heavily-doped source and drain regions 33. It will be noticed that the width of the cleared substrate area 34 is very narrow. A buried contact must be made to this junction region within the substrate. Due to the narrowness of the cleared substrate area 34, it must be widened if successful contact is to be made to the substrate.

Figure 4:
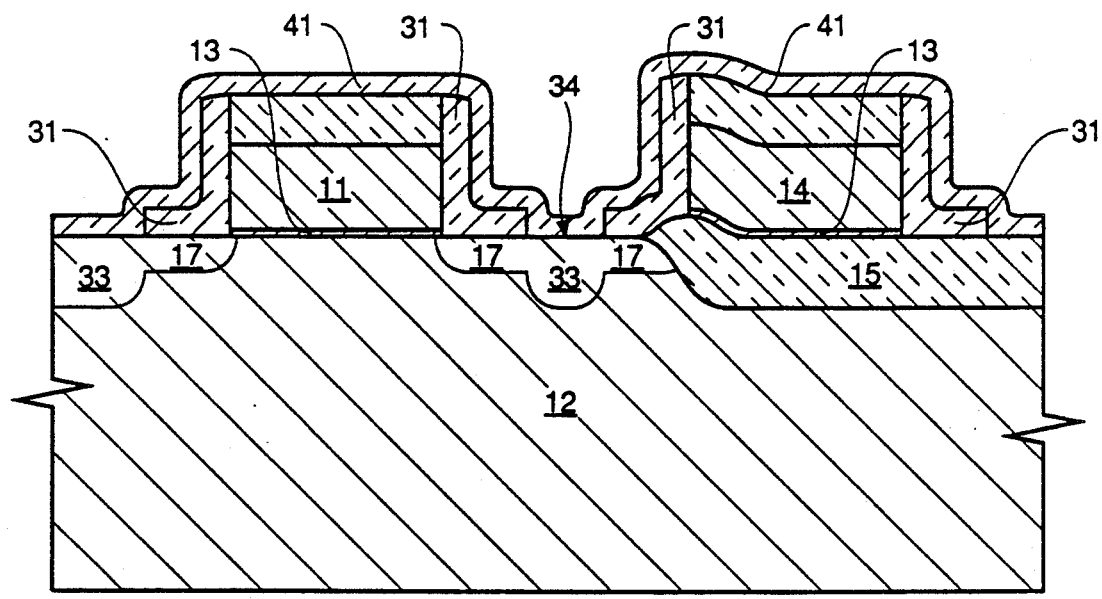
FIG. 4 is a cross-sectional view of the in-process wafer portion of FIG. 3, following the removal of second implant spacer layer remnants and the blanket deposition of a substrate-insulating layer.

Referring now to FIG. 4, second implant spacer layer remnants 32, consisting of ozone-TEOS oxide, are removed with dilute hydrofluoric acid (a mixture of water and acid that is between approximately 4:1 and 1000:1 by volume), leaving first implant spacer layer remnants 31 and field oxide regions 15, both consisting of conventional oxide, virtually intact. The deposition of a conventional oxide substrate-insulating layer 41, the function of which is to insulate the substrate in non-buried contact regions from subsequently-deposited conductive layers, follows.

Figure 5:
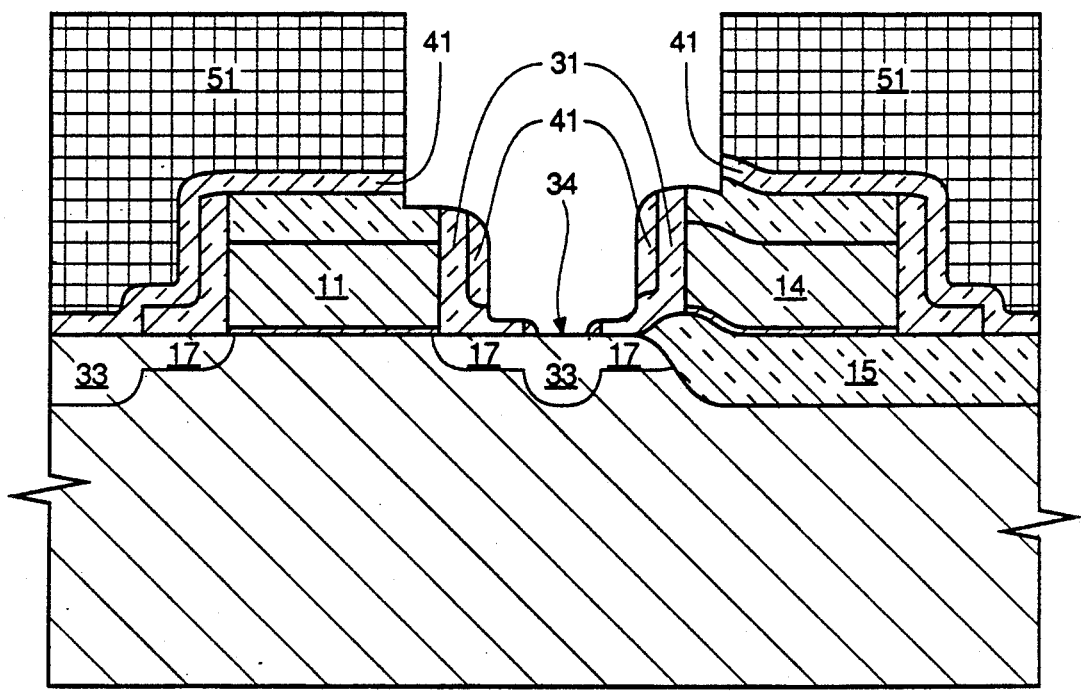
FIG. 5 is a cross-sectional view of the in-process wafer portion of FIG. 4, following the anisotropic etch of existent oxide layers and clearing of the substrate in buried contact regions.

Referring now to FIG. 5, substrate-insulating layer 41 is masked with a contact etch photo mask 51 and etched anisotropically to the extent that a region of substrate 12 between leftmost wordline 11 and rightmost wordline 14 is cleared a second time.

Figure 6:
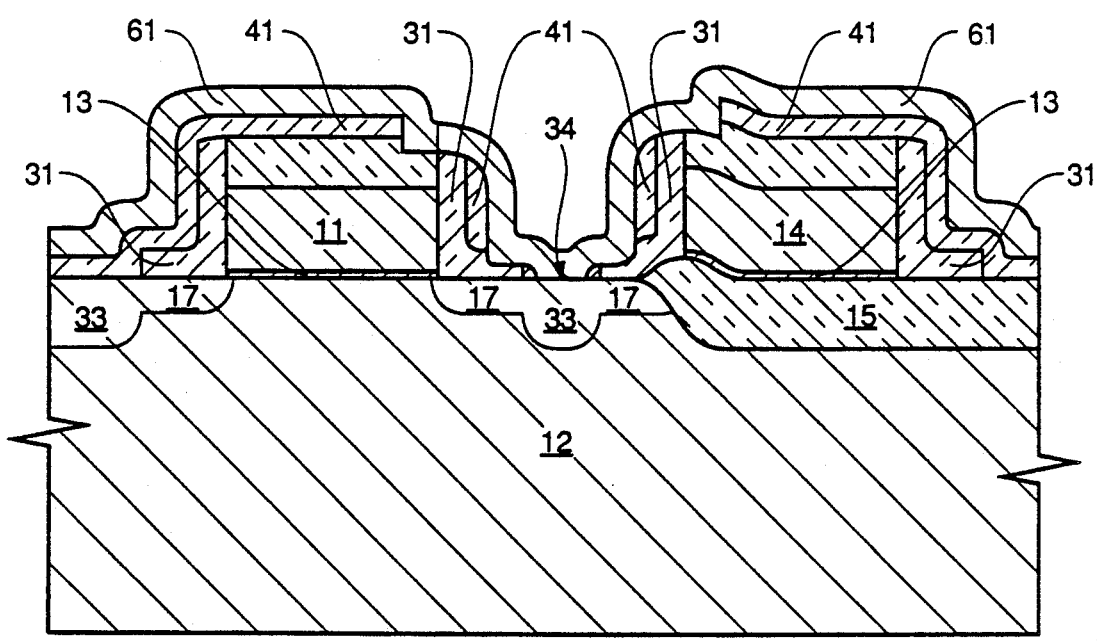
FIG. 6 is a cross-sectional view of the in-process wafer portion of FIG. 5, following the blanket deposition a buried contact conductive layer.

Referring now to FIG. 6, following the stripping of contact etch photo mask 51, a buried contact conductive layer 61 is blanket deposited over the surface of the wafer. Conductive layer 61 will ultimately be patterned and may serve as a storage node plate or a digit line for a DRAM cell capacitor.

Although only a single embodiment of the process has been disclosed herein, it will be obvious to those having ordinary skill in the art of semiconductor fabrication, that changes and modifications may be made thereto without departing from the scope and the spirit of the process, as claimed.

We claim:

1. A process for creating and removing temporary silicon dioxide structures on an in-process integrated circuit with minimal effect on existing permanent structures formed from conventional silicon dioxides that are exposed, said process comprising the following sequence of steps:
    a) blanket deposition of an ozone-TEOS silicon dioxide layer through chemical vapor deposition on top of the in-process integrated circuit, thus covering the permanent structures formed from conventional silicon dioxides;
    b) etching said ozone-TEOS layer to create said temporary structures; and
    c) removing said temporary structures.

2. The process of claim 1, wherein chemical vapor deposition of said ozone-TEOS layer is accomplished by introducing a feed stream containing oxygen gas, ozone gas, and tetraethyl-orthosilicate gas into a deposition chamber, where the gases are heated to approximately 400° C.

3. The process of claim 2, wherein said temporary structures are created using an anisotropic plasma etch.

4. The process of claim 3, wherein said temporary structures are removed with dilute hydrofluoric acid.

5. The process of claim 3, wherein said dilute hydrofluoric acid has a concentration between approximately 4:1 to approximately 1000:1 by volume.

6. The process of claim 1, wherein sidewall implant spacers comprised of both a permanent structure portion and a temporary structure portion are utilized to offset source/drain implants from the edges of conductive strips, which overlie a silicon substrate, and from which FET gates are formed.

7. The process of claim 1, wherein sidewall implant spacers comprised of both a permanent structure portion and a temporary structure portion are utilized to offset source/drain implants from the edges of wordlines.

8. The process of claim 7, wherein said temporary structure portion is removed from said sidewall implant spacers in order to increase the space between adjacent wordlines.

9. The process of claim 8, wherein additional space between adjacent wordlines is required for adequate connection of a buried contact layer to the substrate.

* * * * *